(12) United States Patent
Matsuyama

(10) Patent No.: US 12,429,782 B2
(45) Date of Patent: Sep. 30, 2025

(54) SUBSTRATE PROCESSING APPARATUS AND SUBSTRATE PROCESSING METHOD

(71) Applicant: Tokyo Electron Limited, Tokyo (JP)

(72) Inventor: Kenichirou Matsuyama, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 454 days.

(21) Appl. No.: 17/917,503

(22) PCT Filed: Mar. 26, 2021

(86) PCT No.: PCT/JP2021/013061
§ 371 (c)(1),
(2) Date: Oct. 6, 2022

(87) PCT Pub. No.: WO2021/205918
PCT Pub. Date: Oct. 14, 2021

(65) Prior Publication Data
US 2023/0152716 A1 May 18, 2023

(30) Foreign Application Priority Data
Apr. 8, 2020 (JP) ................. 2020-069929

(51) Int. Cl.
*G03F 7/00* (2006.01)
*H01L 21/677* (2006.01)

(52) U.S. Cl.
CPC .... *G03F 7/70733* (2013.01); *H01L 21/67745* (2013.01)

(58) Field of Classification Search
CPC .......... G03F 7/70733; H01L 21/67745; H01L 21/027; H01L 21/67173; H01L 21/67178;
(Continued)

(56) References Cited

U.S. PATENT DOCUMENTS 8,448,600 B2 * 5/2013 Matsuyama ...... H01L 21/67178
118/66
9,004,788 B2 * 4/2015 Matsuyama ...... H01L 21/67178
396/611
(Continued)

FOREIGN PATENT DOCUMENTS

| JP | 4417134 B2 | 2/2010 |
|----|------------|--------|
| KR | 2015-0032635 A | 3/2015 |
| KR | 2018-0034222 A | 4/2018 |

OTHER PUBLICATIONS

International Search Report issued on Jun. 22, 2021 for WO 2021/205918 A1 (4 pages).

*Primary Examiner* — Michael Collins
(74) *Attorney, Agent, or Firm* — Venjuris, P.C.

(57) ABSTRACT

A substrate processing apparatus includes: a group of modules including a plurality of processing modules that process a substrate and a plurality of relay modules on which the substrates are disposed to be transferred among the plurality of processing modules; a plurality of transfer mechanisms that transfer the substrates in an assigned section of a transfer path; a shared transfer mechanism shared for transfer in a first section and a second section separated from each other in the transfer path of the substrate; and a determination unit that determines a transfer destination of the substrates by the shared transfer mechanism between the first relay module and the second relay module based on a transfer status of the substrate in each section.

11 Claims, 18 Drawing Sheets

(58) Field of Classification Search
CPC ............. H01L 21/67276; H01L 21/677; H01L 21/67769; H01L 21/67742; H01L 21/67766; H01L 21/67778
See application file for complete search history.

(56) References Cited

U.S. PATENT DOCUMENTS

| | | | |
|---|---|---|---|
| 10,489,902 B2 * | 11/2019 | Kim | G01N 21/95623 |
| 2004/0111339 A1 * | 6/2004 | Wehrung | G06Q 40/12 |
| | | | 705/30 |
| 2005/0024610 A1 * | 2/2005 | Nishi | G03F 7/70725 |
| | | | 355/53 |

* cited by examiner

SUBSTRATE PROCESSING APPARATUS AND SUBSTRATE PROCESSING METHOD

CROSS REFERENCE TO RELATED APPLICATIONS

This application is a national phase of PCT application No. PCT/JP2021/013061, filed on 26 Mar. 2021, which claims priority from Japanese patent application No. 2020-069929, filed on 8 Apr. 2020, all of which are incorporated herein by reference.

TECHNICAL FIELD

The present disclosure relates to a substrate processing apparatus and a substrate processing method.

BACKGROUND

In a manufacturing process of a semiconductor device, various processes such as photolithography are performed on a semiconductor wafer (hereinafter, referred to as a wafer) serving as a substrate. A substrate processing apparatus that processes wafers may be configured such that a transfer mechanism sequentially transfers wafers to a plurality of processing modules that performs different processes.

Patent Document 1 describes a substrate transfer apparatus which performs a first operation of transferring a substrate from a processing unit that processes the substrate to a substrate storage unit, and a second operation other than the first operation of transferring the substrate among the processing units, respectively. Priority is given to the first operation when a need arises to perform the first operation during the second operation, and priority is given to the second operation otherwise.

PRIOR ART DOCUMENT

Patent Document

Patent Document 1: Japanese Patent Publication No. 4417134

SUMMARY OF THE INVENTION

Problems to be Solved

The present disclosure provides a technology capable of obtaining a high throughput in a substrate processing apparatus that transfers and processes substrates among a plurality of processing modules.

Means to Solve the Problems

A substrate processing apparatus of the present disclosure includes: a module group including a plurality of processing modules each processing substrates and a plurality of relay modules on which the substrates are respectively disposed to be transferred among the plurality of processing modules; a plurality of transfer mechanisms each transferring the substrates in an assigned section of a transfer path so that the substrates are loaded into and unloaded from the processing modules by a common transfer mechanism, the substrates are loaded into and unloaded from the relay modules by different transfer mechanisms, and the substrates are sequentially transferred on the transfer path of the substrate constituted by the module group; a shared transfer mechanism that forms one of the plurality of transfer mechanisms, is shared for transfer in a first section and a second section separated from each other in the transfer path of the substrate, and transfers the substrate to each of a first relay module included in the first section and a second relay module included in the second section among the plurality of relay modules; and a determination unit that determines a transfer destination of the substrate by the shared transfer mechanism between the first relay module and the second relay module based on a transfer status of the substrate in each section from each of the first relay module and the second relay module to a relay module immediately before a nearest processing module when viewed from each of the first relay module and the second relay module to a downstream side of the transfer path.

Effect of the Invention

According to the present disclosure, a high throughput may be obtained in a substrate processing apparatus that transfers and processes substrates among a plurality of processing modules.

DETAILED DESCRIPTION TO EXECUTE THE INVENTION

Figure 1:
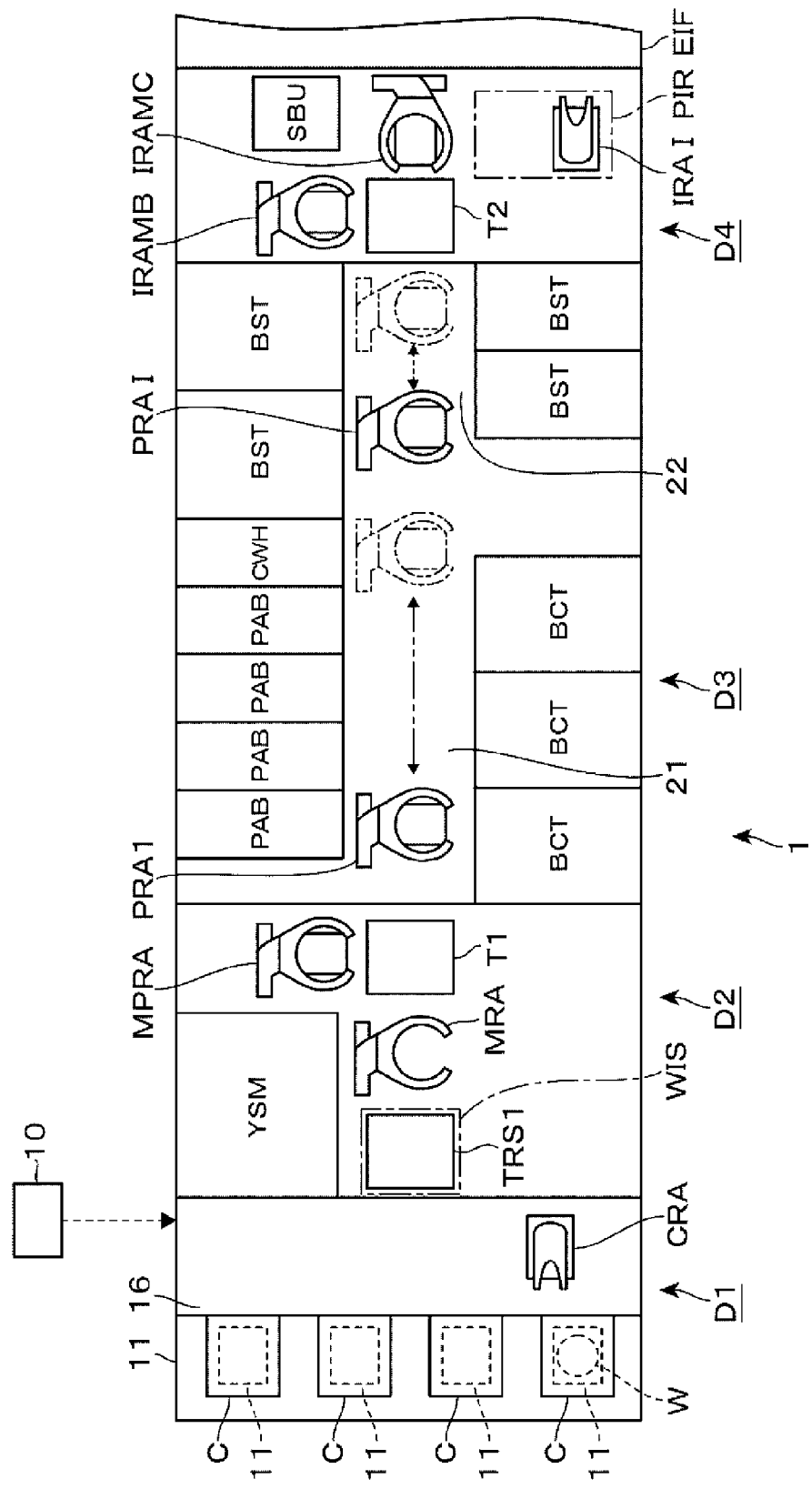
FIG. 1 is a cross-sectional plan view of a coating and developing apparatus that is an embodiment of the present disclosure.

A coating and developing apparatus 1, which is an embodiment of a substrate processing apparatus of the present disclosure, will be described with reference to the longitudinal front view of FIG. 2, which is a cross-sectional plan view of FIG. 1. The coating and developing apparatus 1 includes a carrier block D1, an inspection block D2, a processing block D3, and an interface block D4 which are horizontally disposed in this order and connected to each other. In the following description, a direction in which the blocks D1 to D4 are disposed is defined as the horizontal direction, the carrier block D1 side is defined as the left side, and the interface block D4 side is defined as the right side. An exposure machine EIF for liquid immersion exposure is connected to the right side of the interface block D4. Regarding the front and rear direction of the coating and developing apparatus, when the carrier block D1 is viewed on the left side and the interface block D4 is viewed on the right side, the front side is defined as the front side, and the depth side is defined as the rear side.

The coating and developing apparatus 1 includes multiple modules and multiple transfer mechanisms (transfer arms). A carrier C that stores a plurality of wafers W for each lot is transferred from the outside of the coating and developing apparatus 1. The multiple transfer mechanisms in the coating and developing apparatus 1 transfer the wafer W through each assigned section of the transfer path, and the wafer W moves through each module constituting the transfer path in turn. Thus, the wafer W is returned to the carrier C after undergoing a series of processes. For convenience of illustration, in FIG. 2, a part of the transfer mechanisms is illustrated at positions shifted left and right from the positions illustrated in FIG. 1.

A module is a place where the wafer W is disposed, and includes a processing module for processing the wafer W and a module on which the wafer W is disposed to relay the transfer of the wafer W among the processing modules (referred to as a relay module). The relay module includes a delivery module TRS, a buffer module SBU, and a temperature regulation module ICPL. The TRS and the SBU are configured such that a plurality of wafers W may be disposed vertically. For example, the modules are provided with a plurality of pins or stages positioned at different heights, and the wafer W is disposed on the pins or stages. The area where the wafer W is disposed on the pins or stages is called a slot, and the SBU has more slots than the TRS. The temperature regulation module ICPL has a stage whose temperature is regulated, and regulates the temperature of the wafer W disposed thereon.

Further explaining the modules, for each of the relay modules described above, wafers W are loaded by one transfer mechanism and the wafers W are unloaded by another transfer mechanism. That is, the transfer mechanisms used for loading and unloading are different from each other. Meanwhile, a common transfer mechanism is used for loading and unloading the wafers W from the processing module. The processing module is a module that performs process such as liquid process and heat process on the wafers W, and inspection of the wafers W is also included in the processing. Further, the exposure machine EIF is also treated as a processing module in performing the transfer control (to be described later).

The above-described delivery modules TRS are provided at various places in the apparatus, and in the following description and each drawing, numbers may be added after "TRS" to distinguish the delivery modules from each other. The numbers are attached according to the order in which the wafers W are transferred on the transfer path. As processing modules, temperature control modules SCPL configured to be able to control the temperature of the wafer W, like the ICPL, are provided at various locations in the apparatus. Like the TRS, the SCPL is also indicated by numbers in the order of transfer. With respect to the numbers of TRS and SCPL provided at the same step in the transfer path, in FIG. 2, the number is displayed less than the actual number to avoid complication of the drawing.

Figure 3:
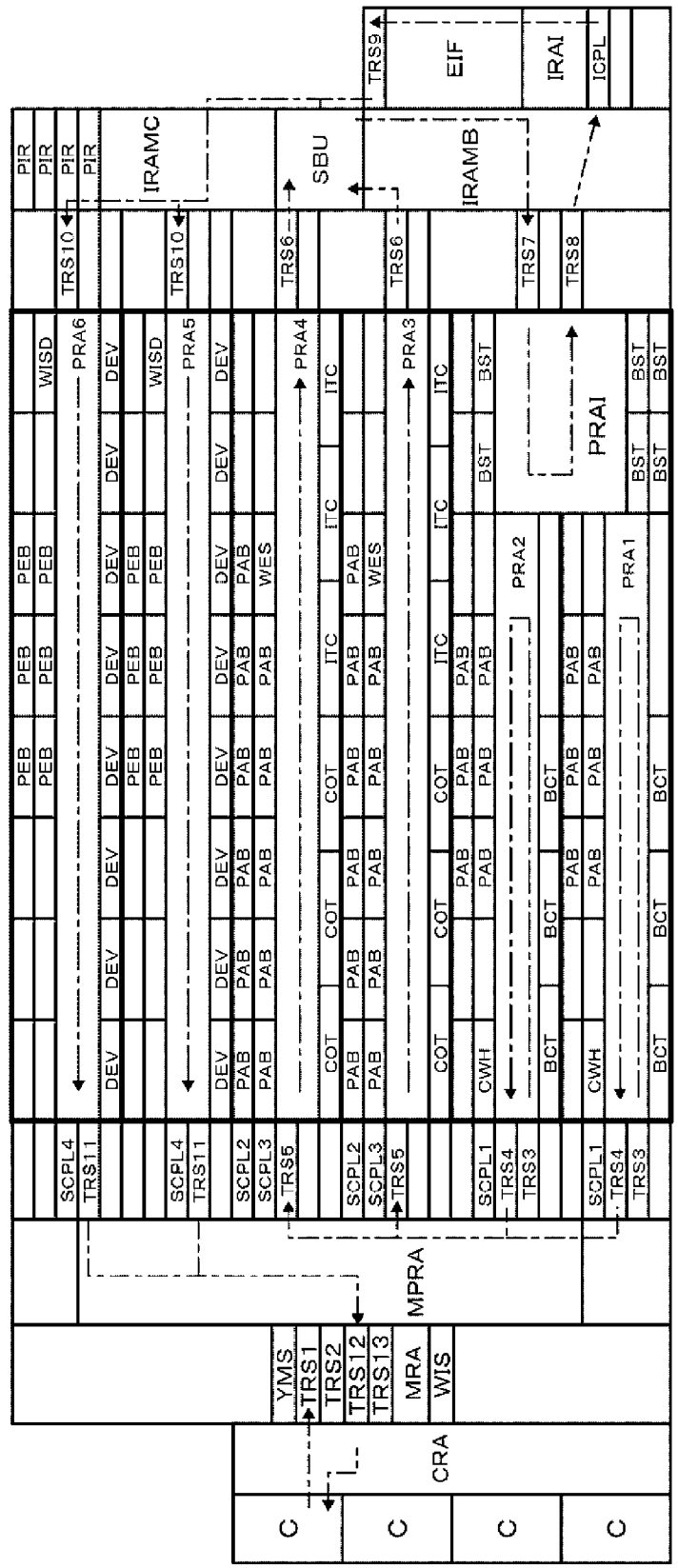
FIG. 3 is a schematic view illustrating an outline of the arrangement of a module and a transfer mechanism in the coating and developing apparatus.

FIG. 3 schematically illustrates the arrangement of each module and a transfer mechanism in the coating and developing apparatus 1. However, in order to avoid complicated explanation, a part of the modules provided in the actual apparatus is not illustrated. FIG. 3 indicates an outline of the transfer path of the wafer W within the apparatus by the dashed line arrow. When there are a plurality of modules to which the wafer W is to be transferred, the wafer W is transferred to one of the modules.

Each block constituting the coating and developing apparatus 1 will be described below. The carrier block D1 includes a plurality of carrier stages 11 on which the carriers C are respectively disposed, and a CRA, which is a transfer mechanism for transferring the wafers W between the carriers C and the coating and developing apparatus 1. The inspection block D2 includes an inspection module WIS for inspecting the wafer W before being processed by the coating and developing apparatus 1, and an inspection module YSM for inspecting the wafer W after being processed by the coating and developing apparatus 1, and transfers the wafer W to each height of the processing block D3.

A stack of transfer modules TRS (TRS1, TRS13), a transfer mechanism MRA, and a tower T1 are provided in this order from left to right in the front and rear center of the inspection block D2. The inspection module WIS is provided above TRS1 and TRS13, and the inspection module YSM is provided behind MRA. The MRA may access the TRS1, the TRS13, each inspection module, and certain modules contained in tower T1. MPRA serving as a transfer mechanism is provided behind the tower T1, and the MPRA may access each module of the tower T1.

The tower T1 is configured by stacking multiple delivery modules TRS and multiple temperature control modules SCPL. Although details will be described later, the processing block D3 is configured by stacking unit blocks E1 to E6. Corresponding to the configuration of the processing block D3, in the tower T1, delivery modules TRS (TRS3 to TRS5, TRS11) and temperature control modules SCPL (SCPL1 to SCPL4) are provided at a height at which the transfer mechanism provided in each unit block E (E1 to E6) may transfer the wafer W. In addition to the delivery TRS for each unit block E, TRS (TRS2, TRS12) for delivery of the wafer W within the inspection block D2 are provided in the tower T1.

Next, the processing block D3 will be described. The processing block D3 is configured by stacking unit blocks E (E1 to E6) that perform liquid process and heat process, respectively, on the wafer W in order from the bottom, and the same processing is performed between the unit blocks E1 and E2, between the unit blocks E3 and E4, and between the unit blocks E5 and E6. In the unit blocks E1 and E2, formation of an anti-reflection film and cleaning of the back surface of the wafer W before exposure are performed. In the unit blocks E3 and E4, formation of a resist film on the anti-reflection film and formation of a protective film for protecting the resist film during liquid immersion exposure are performed. Development processing is performed in the unit blocks E5 and E6. Therefore, the wafer W is transferred between the unit blocks in the order of E1, E2→E3, E4→E1, E2→E5, E6. The wafer W is transferred along the transfer path 21 separated for each unit block E, but the transfer path 21 is not separated on the right side of the unit blocks E1 and E2, and is configured as a transfer path that straddles the unit blocks E1 and E2.

Figure 4:
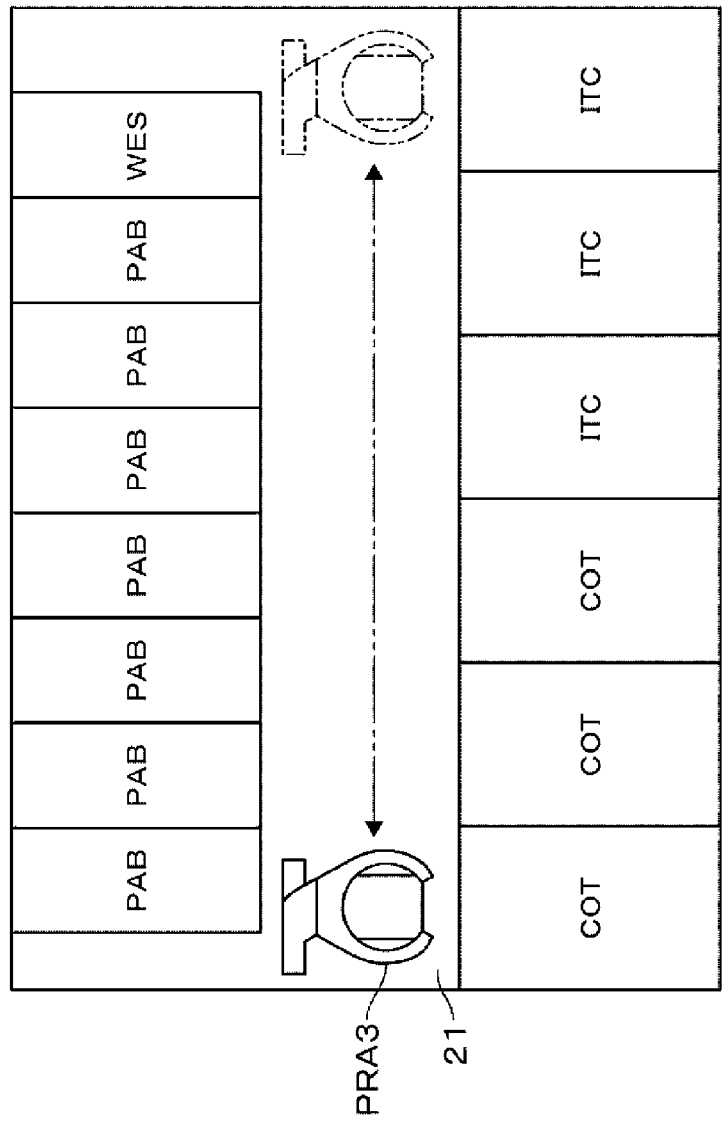
FIG. 4 is a plan view of a processing block provided in the coating and developing apparatus.

The unit block E3 will be described with reference to the plan view of FIG. 4. The transfer path 21 extends to the left and right, and three resist coating modules COT and three chemical solution coating modules ITC for forming a protective film are provided along the transfer path 21 on the front side of the transfer path 21. Eleven heating modules PAB and an inspection module WES for inspecting the wafer W after forming the protective film are provided on the rear side of the transfer path 21. A part of the eleven heating modules PAB is stacked in two stages and disposed along the transfer path 21. Several of the heating modules PAB are used to heat the wafer W after forming the resist film, and other ones are used to heat the wafer W after forming the protective film. The transfer path 21 is provided with a PRA3 as a transfer mechanism. The PRA3 accesses each module provided in the unit block E3 and modules provided at the height of the unit block E3 in the tower T1 and the tower T2 (to be described later).

The unit block E4 has the same configuration as the unit block E3. Regarding the unit block E5, focusing on the differences from the unit blocks E3 and E4, eight development modules DEV are provided on the front side of the transfer path 21. In actuality, plural types of DEV supplying different developing solutions are provided, but a detailed description thereof is omitted. Six heating modules PEB for performing post exposure baking, respectively, and an inspection module WISD for inspecting the wafer W after development are provided on the rear side of the transfer path 21. The unit block E6 has the same configuration as the unit block E5. The transfer mechanisms corresponding to PRA3 provided in unit blocks E4 to E6 are indicated as PRA4 to PRA6 in FIG. 2.

Next, the unit block E1 will be described with reference to FIG. 1, focusing on differences from the unit block E3. As described above, the transfer path of the unit block E1 includes the transfer path 21 separated from the transfer path of the unit block E2 on the left side and the transfer path 22 leading to the transfer path of the unit block E2 on the right side. Three chemical solution coating modules BCT for forming an anti-reflection film are provided in front of the transfer path 21. Six heating modules PAB for heating the wafer W on which the anti-reflection film has been formed, and a hydrophobizing module CWH for hydrophobizing the wafer W are provided behind the transfer path 21. The transfer path 21 is provided with PRA1 as a transfer mechanism corresponding to PRA3.

With respect to the unit block E2, the left side thereof is configured in the same manner as the left side of the unit block E1, and the transfer path 21 is provided with PRA2 corresponding to PRA3. A total of six back surface cleaning modules BST is provided in the front and rear of the transfer path 22 spanning the unit blocks E1 and E2, and the back surface cleaning modules BST are disposed side by side two by two along the transfer path 22. The transfer path 22 is provided with a PRAI, which is a common transfer mechanism for the unit blocks E1 and E2, and accesses each module provided at the height of the unit blocks E1 and E2 in each BST and a tower T2 (to be described later).

Figure 2:
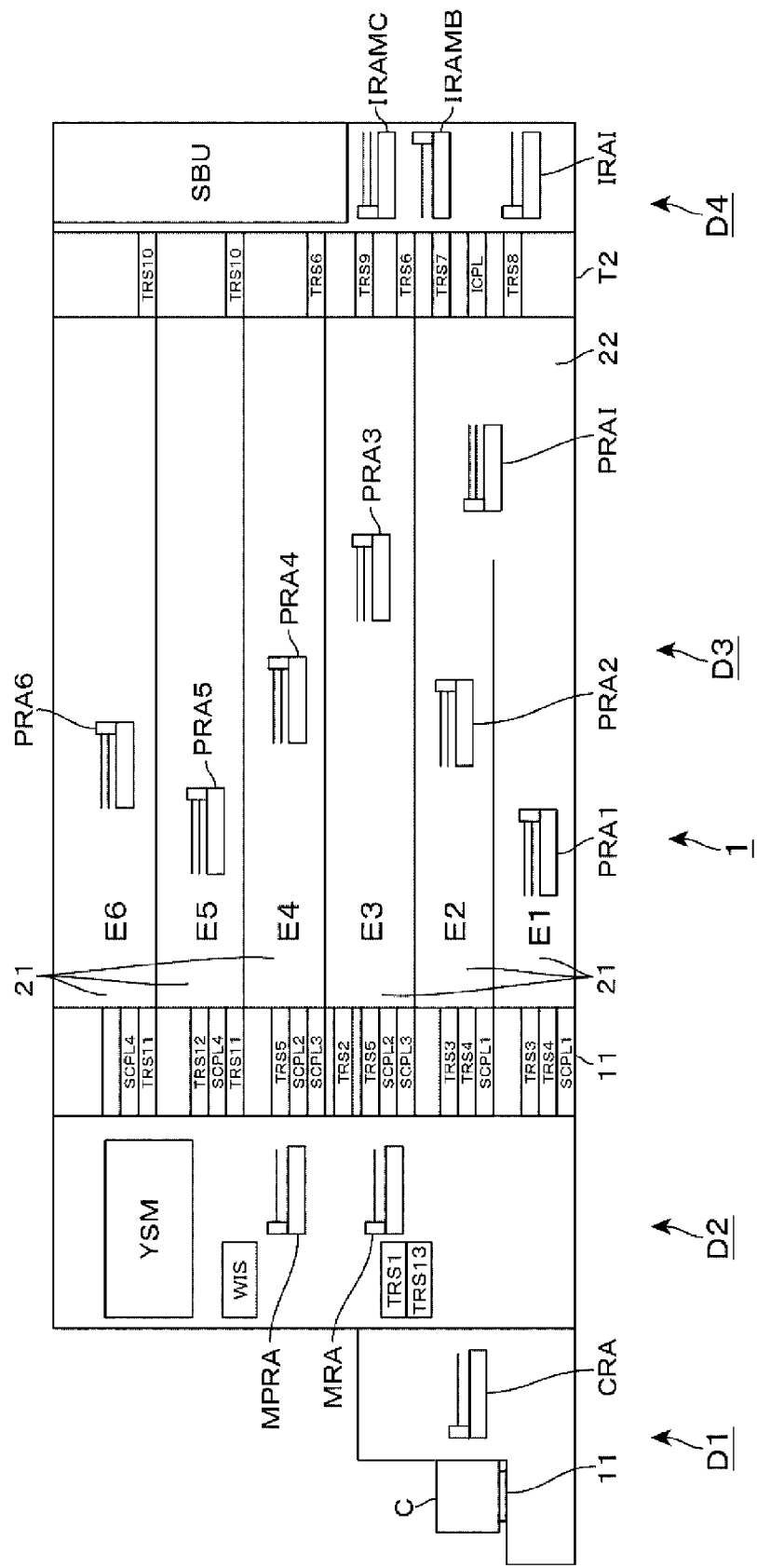
FIG. 2 is a longitudinal side view of the coating and developing apparatus.
Figure 5:
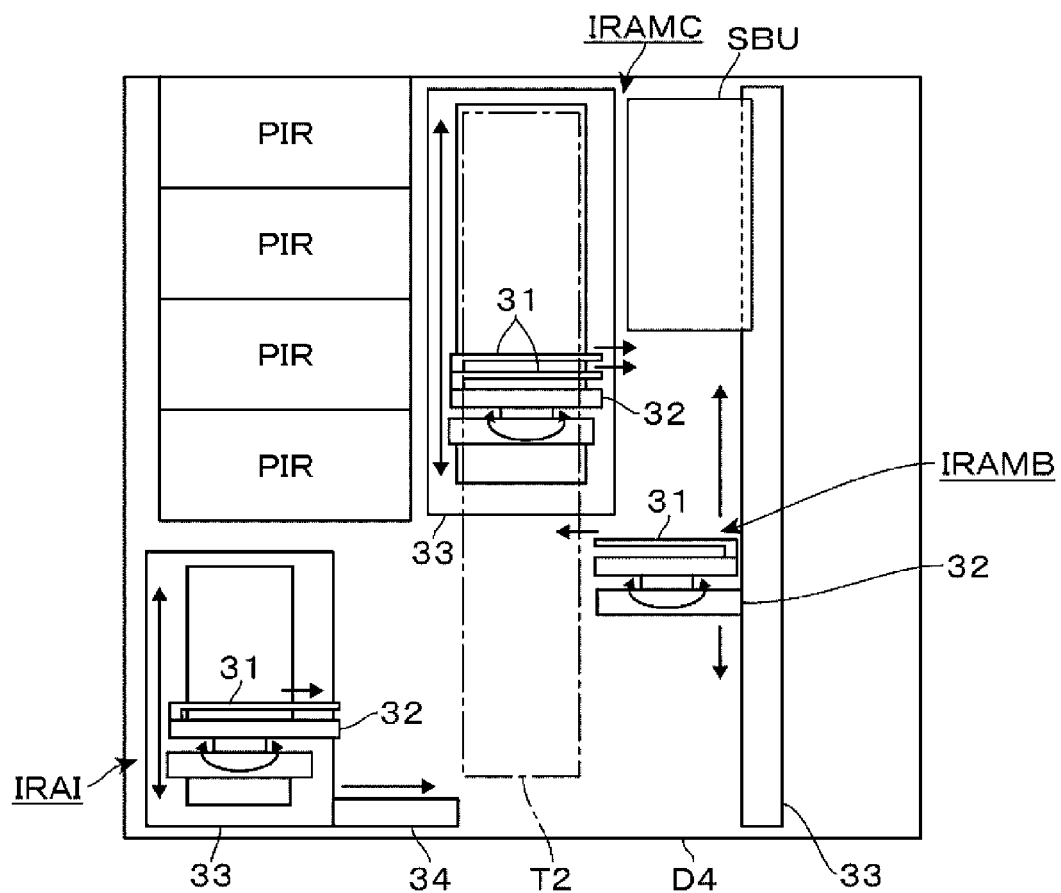
FIG. 5 is a longitudinal side view of an interface block provided in the coating and developing apparatus.

Next, the interface block D4 will be described with reference to FIG. 1 illustrating a plan view and FIG. 5 illustrating a longitudinal side view. The above-described tower T2 is provided on the left side of the front and rear center of the interface block D4. The tower T2 is configured by stacking a plurality of delivery modules TRS (TRS6 to TRS10) and a plurality of temperature regulation modules ICPL. Four cleaning modules PIR are disposed vertically in the right rear of the upper part of the tower T2, and each PIR cleans the wafer W and removes the protective film before PEB after exposure performed by the exposure machine EIF. A buffer module SBU is provided on the right rear of the upper part of the tower T2.

The interface block D4 includes transfer mechanisms IRAMC, IRAMB, and IRAI. The transfer mechanism IRAMC is located on the right side of the tower T2 and in the front and rear center of the interface block D4, and accesses the cleaning module PIR, the buffer module SBU, and each TRS from the top to the middle of the tower T2, respectively. The transfer mechanism IRAMB is located behind the tower T2 and accesses the module and SBU at each height of the tower T2. The transfer mechanism IRAI accesses the exposure machine EIF, the ICPL provided on the lower part of the tower T2, and the TRS at the center of the height of the tower T2.

Each transfer mechanism provided in the coating and developing apparatus 1 will be additionally described. Each transfer mechanism includes a substrate holding unit 31, a base 32, and a moving unit 33 (see, e.g., FIG. 5). The substrate holding unit 31 advances and retreats on the base 32. The base 32 is configured to be able to rotate around a vertical axis and move up and down by the moving unit 33. The CRA, PRA1 to PRA6, PRAI, and IRAI are provided with a horizontal movement mechanism 34 for horizontally moving the moving unit 33, and are configured to be able to access each module and each carrier C described above.

Each of the transfer mechanisms PRA1 to PRA6, PAI, and IRAMC includes two substrate holding units 31, and the two substrate holding units 31 advance and retreat on the base 32 independently of each other. Thus, in the transfer mechanisms, one substrate holding unit 31 may advance and retreat to receive the wafer W from the module, and then the other substrate holding unit 31 may enter the module to transfer the held wafer W to the corresponding module. In other words, the wafer W may be replaced in the module without laterally moving and rotating the base 32. The wafer W is transferred from the preceding module to the module to be replaced, then the above replacement of the wafer W in the module to be replaced is performed, and then the wafer W received by the replacement is transferred to the subsequent module of the module to be replaced.

The coating and developing apparatus 1 includes a control unit 10 (see, e.g., FIG. 1). The control unit 10 is composed of a computer, and includes a program, memory, and CPU. The program includes a group of steps so that a series of operations in the coating and developing apparatus 1 may be performed. Then, the control unit 10 outputs a control signal to each unit of the coating and developing apparatus 1 according to the program, and the operation of each unit is controlled. Thus, the transfer of the wafer W and the processing of the wafer W of the present embodiment are performed. The above-described program is stored in a storage medium such as a compact disk, a hard disk, or a DVD, and installed in the control unit 10.

Figure 6:
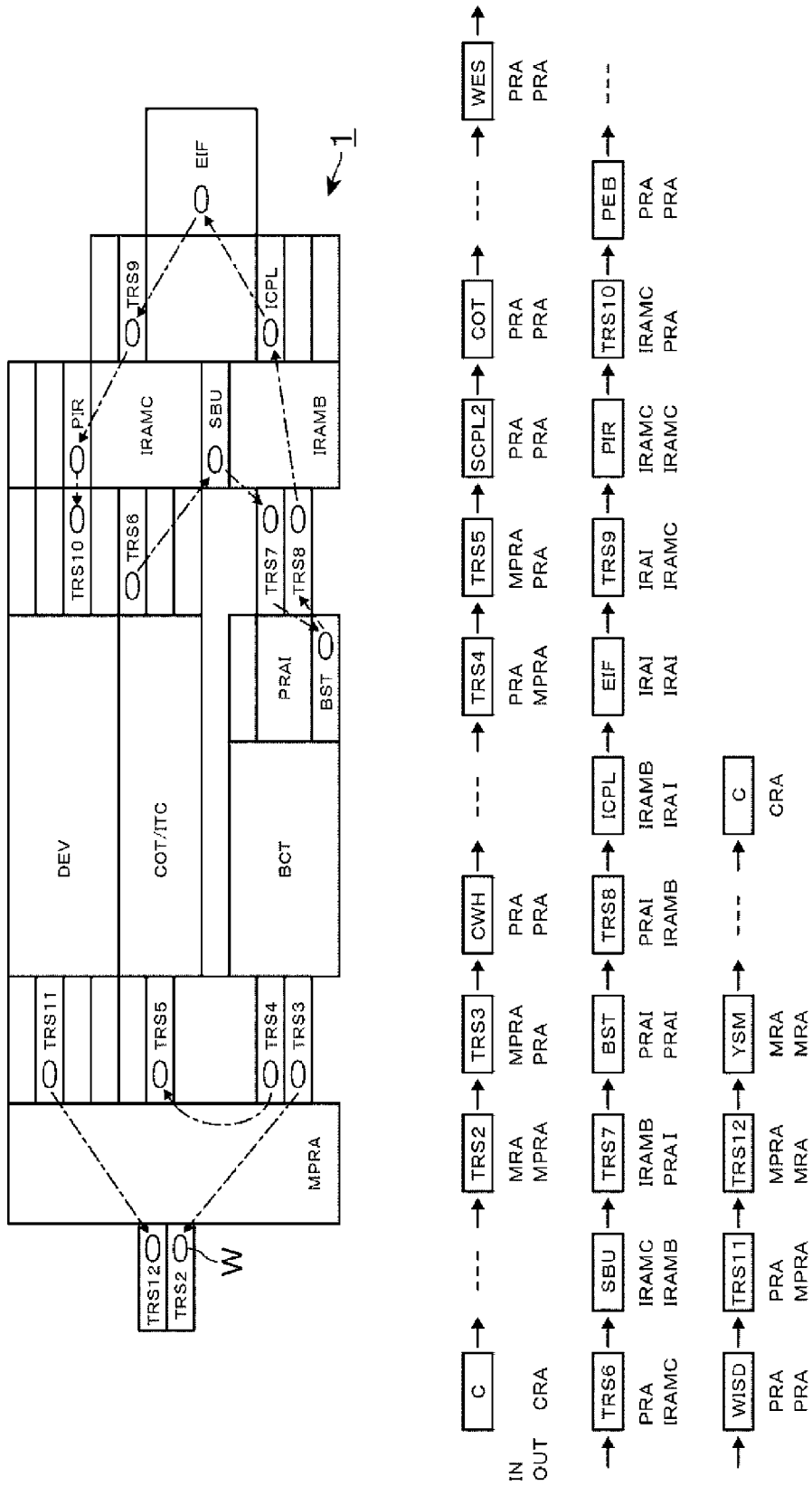
FIG. 6 is a schematic view illustrating a transfer path of a wafer in the coating and developing apparatus.

Subsequently, a series of processes performed on the wafer W and the transfer of the wafer W performed in the coating and developing apparatus 1 will be described with reference to FIG. 6. The upper part of FIG. 6 is a schematic view of the coating and developing apparatus 1 for illustrating the transfer path of the wafer W. The lower part of FIG. 6 illustrates the modules in the order of transfer. The transfer mechanism used for loading/unloading to/from the module is indicated under each module. The transfer mechanism used for loading is illustrated on the upper side, and the transfer mechanism used for unloading is illustrated on the lower side.

A wafer W is taken out from the carrier C by the CRA of the carrier block D1 and transferred to the delivery module TRS1 of the inspection block D2. The wafer W is transferred to the inspection module WIS by the MRA and inspected, then transferred to the TRS2 of the tower T1 by the MRA, and then transferred to the TRS3 of the tower T1 by the MPRA.

The wafer W transferred to the TRS3 is transferred through the unit blocks E1 and E2 in the order of CWH, SCPL1, BCT, and PAB by the PRA1 or PRA2, and undergoes, in order, a hydrophobizing process, a temperature adjustment, an anti-reflection film forming process, and a heat treatment, and is then transferred to the TRS4. Then, the wafer W in TRS4 is transferred to TRS5 by MPRA.

The wafer W of TRS5 is transferred through the unit block E3 or E4 in the order of SCPL2 of the tower T1, resist coating module COT, heating module PAB, SCPL3 of the tower T1, chemical solution coating module ITC, heating module PAB, and inspection module WES by the PRA3 or PRA4. Thus, the wafer W undergoes, in order, a temperature adjustment, a resist film formation process, a heat treatment, a temperature adjustment, a protective film formation process, a heat treatment, and an inspection, and is transferred to TRS6 of the tower T2 by PRA3 or PRA4.

The wafer W transferred to the TRS6 is transferred to the SBU by the IRAMC and held therein, and then transferred to TRS7 of the tower T2 by the IRAMB. Then, the wafer W is transferred to the BST by PRAI, where the back surface is cleaned, transferred to TRS8, and then transferred to the ICPL by the IRAMB. Thereafter, the wafer W is transferred to the exposure machine EIF by the IRAI, and the resist film is exposed along a predetermined pattern.

The wafer W is unloaded from the exposure machine EIF by the IRAI and transferred to TRS9 of the tower T2, then transferred to the cleaning module PIR by the IRAMC and cleaned, and then transferred to TRS10 by the IRAMC. The wafer W transferred to TRS10 is transferred through the unit block E5 or E6 by PRA5 or PRA6 in the order of the heating modules PEB and SCPL4, development module DEV, and inspection module WISD. As a result, the wafer W undergoes, in order, a heat treatment, a temperature adjustment, a development process, and an inspection. A resist pattern is formed along the exposed pattern by the development process. Then, the wafer W is transferred to TRS11 of the tower T1 by the PRA5 or PRA6, transferred to TRS12 by the MPRA, and then transferred to the inspection module YSM by the MRA and inspected. Thereafter, the wafer W is transferred to TRS13 by the MRA and returned to the carrier C by the CRA.

In the transfer path of the wafer W described above, the range in which one transfer mechanism transfers the wafer W is described as a "layer." For example, since PRA3 is transferred to the range from TRS5 to TRS6 as described above, the modules included in the range constitute a layer corresponding to the PRA3. Therefore, a layer corresponds to each section divided for each transfer mechanism that takes charge of transfer on the transfer path. For each layer, layers corresponding to transfer mechanisms other than PRA (PRA1 to PRA6) are illustrated with the same name as the transfer mechanism. Accordingly, the layers are referred to as a CRA layer, MRA layer, MPRA layer, PRAI layer, IRAI layer, IRAMB layer, and IRAMC layer. A layer corresponding to PRA1 and PRA2 is a BCT layer, a layer corresponding to PRA3 and PRA4 is a COT/ITC layer, and a layer corresponding to PRA5 and PRA6 is a DEV layer. Therefore, when viewing the layer as a unit, the wafer W is transferred in the order of the CRA layer→MRA layer→MPRA layer→BCT layer→MPRA layer→COT/ITC layer→IRAMC layer→IRAMB layer→PRAI layer→IRAMB layer→IRAI layer→IRAMC layer→DEV layer→MPRA layer→MRA layer→CRA layer.

In the BCT layer, COT/ITC layer, and DEV layer, the transfer mechanism of each layer cyclically moves the modules in the layer in order repeatedly, and the wafer W is replaced with respect to each module except for the modules in the entrance and exit of the layer. As a result, wafers W are sequentially transferred from the upstream module to the downstream module one by one in each of the layers. The IRAMC layer and the PRAI layer may also be replaced and transferred in the same way as the BCT layer, but a determination as to whether to perform the replacement and transfer in the layers is performed based on the block cycle time (abbreviated as a block CT), which is a time parameter calculated for each layer. Performing the replacement and transfer enables a transfer (cyclic transfer) in which the transfer mechanism repeats and cyclically moves each module in the layer. By performing the cyclic transfer, the movement of the transfer mechanism within the layer is suppressed, and the wafer W is transferred efficiently.

The above-mentioned block CT will be described below. A lot of the wafer W of each carrier C is associated with a process job (PJ), and the PJ designates a processing recipe to be performed on the wafer W. From the processing recipe, for each processing module, "processing time of wafer W"+"time needed before and after processing"="needed residence time of wafer W in module (MUT: Module Using Time)" is calculated. Further, the MUT cycle time (MUTCT) is calculated by dividing the MUT of the processing modules at the same step in the transfer path by the total number of available processing modules. As an example of MUTCT calculation, three BCT are provided in the unit blocks E1 and E2, in total, six BCT are provided, and it is assumed that all of the BCT may be used. Assuming that the MUT of the BCT is 66.0 seconds, the MUTCT of the BCT is 66.0 seconds/6=11.0 seconds.

Then, the maximum value of the MUTCT is determined for each layer. In the BCT layer, the wafer W is transferred in the order of TRS3→CWH→SCPL1→BCT→TRS4 as described above, and the processing modules within the layer are CWH, SCPL1, and BCT. Therefore, the maximum value of the MUTCT calculated for the processing modules is determined. For example, it is assumed that MUTCT=11.0 seconds of the above BCT is determined as the maximum value. This means that the processing of the wafer W in the BCT layer is rate-determined by the BCT when the arm cycle time, which is the transfer time of the wafer W (to be described later), is not considered.

Next, the number of arm processes will be described. The number of arm processes is the number of steps for how many times the transfer mechanism (transfer arm) transfers the wafer W from the entrance to the exit of the layer. In the BCT layer, since the wafer W is transferred among the five modules as described above, the number of arm processes is four, which is the number among the modules. The set time needed for one arm process may be predetermined, for example, 3.7 seconds. Arm cycle time (ACT)=number of arm processes×set time/number of layers for which the same process is performed. Since the BCT layers are provided in the unit blocks E1 and E2, respectively, the same process is performed and the number of layers performing the same process is two. Therefore, ACT=4*3.7÷2=7.4 seconds.

Comparing the maximum value of MUTCT with ACT in the BCT layer, the maximum value of MUTCT of 11.0 seconds is greater than the ACT of 7.4 seconds. Therefore, the rate limiting factor for productivity in the BCT layer is the process in the BCT, not the operation of the transfer mechanism. In this way, in the layer, the maximum value of MUTCT and ACT are compared, and the larger one is taken as the above block CT. The block CT calculated in this way is the time needed for one cycle of transfer in the layer, that is, the time needed for performing one transfer between the modules that the transfer mechanism takes charge of, and corresponds to the expected time interval for transferring the wafer W to the subsequent layer. As described above, the processing time of the processing module is used to calculate the block CT. However, when the control unit 10 obtains information on the interval at which wafers W are unloaded from the exposure machine EIF, the processing time of the exposure machine EIF is determined.

Figure 7:
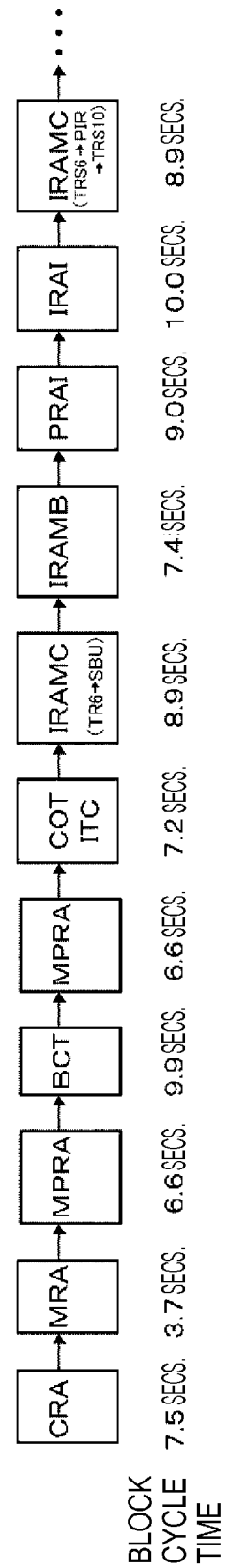
FIG. 7 is a view illustrating layers through which a wafer passes.

In FIG. 7, each layer is arranged in order of the transfer path of the wafer W, and the calculated block CT (unit: seconds) is illustrated below each layer. Numerical values for the block CT are provided to aid understanding of the transfer control (to be described later), and do not necessarily match actual numerical values. As for the block CT of the BCT layer, a value different from the value represented in the above explanation of the method of calculating the block CT is illustrated. For example, the wafer W passes through the MPRA layer, the IRAMC layer, etc. a plurality of times. Since the block CT is calculated and defined as described above, the block CT is the same in the same layer, and the block CT with the same value is described in the same layer in each stage in the drawing. The transfer by the transfer mechanism IRAMC when the block CT is calculated as illustrated in FIG. 7 will be described with reference to the schematic views of FIGS. 8 to 16. In the schematic views, the modules in the interface block D4 are arranged in the vertical direction according to the order in which the wafers W are transferred.

As illustrated in FIGS. 6 and 7, the transfer mechanism IRAMC is shared for the transfer of the transfer module TRS6→buffer module SBU (second section) and the transfer module TRS9→cleaning module PIR→delivery module TRS10 (first section) in the transfer path. PIR corresponds to one processing module, and TRS10, SBU, and TRS9 correspond to the first relay module, the second relay module, and the third relay module, respectively.

Figure 8:
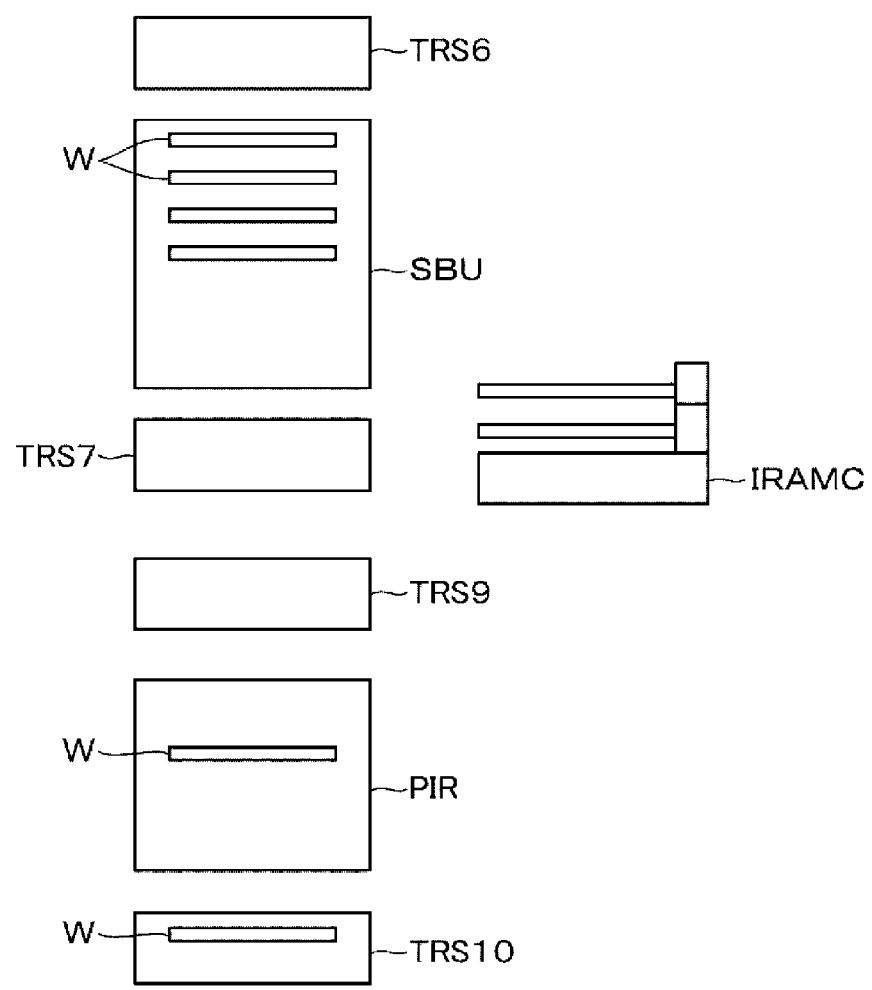
FIG. 8 is a schematic view illustrating the transfer status of a wafer.
Figure 9:
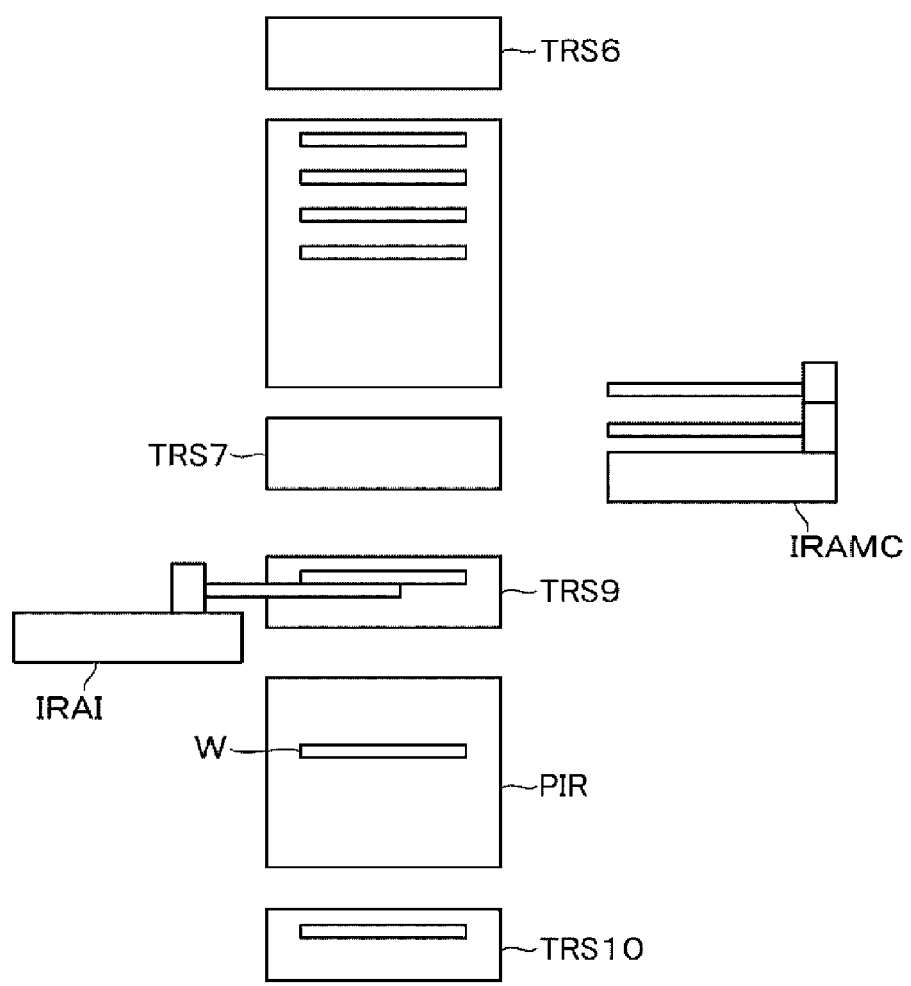
FIG. 9 is a schematic view illustrating the transfer status of a wafer.
Figure 10:
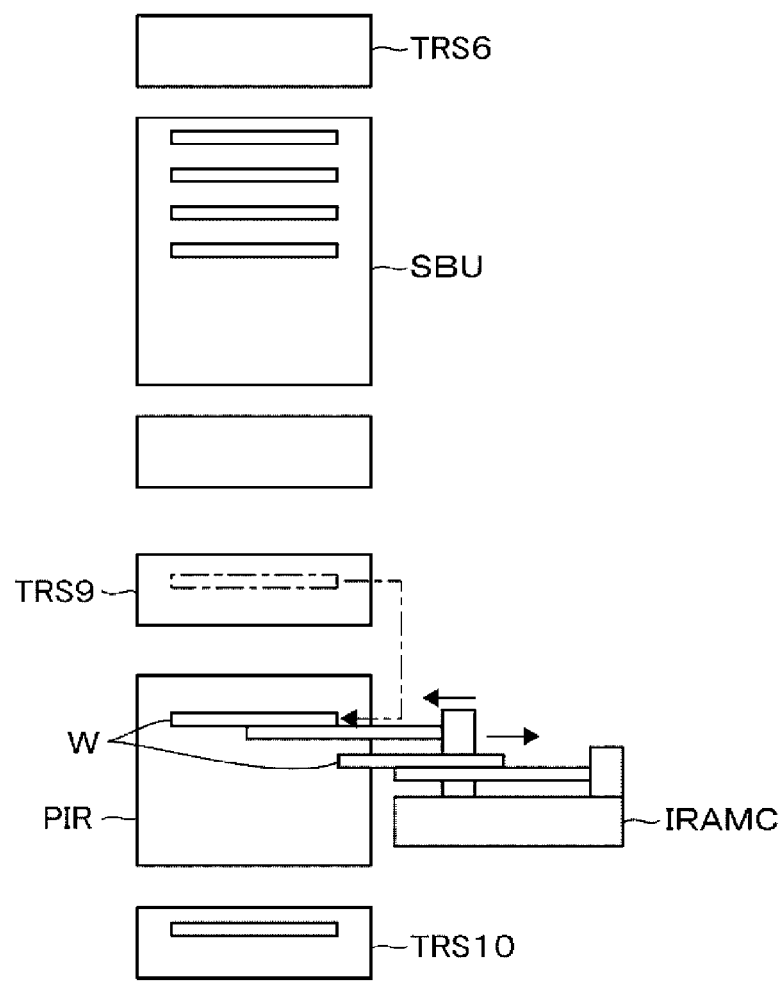
FIG. 10 is a schematic view illustrating the transfer status of a wafer.
Figure 11:
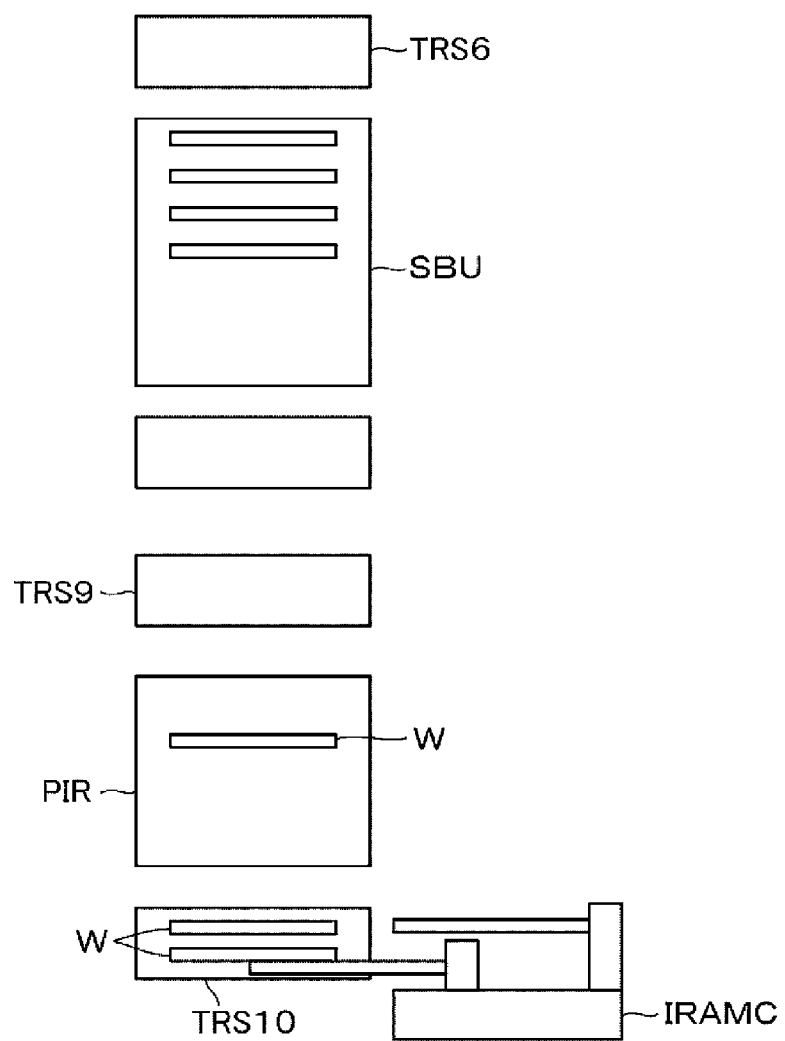
FIG. 11 is a schematic view illustrating the transfer status of a wafer.
Figure 12:
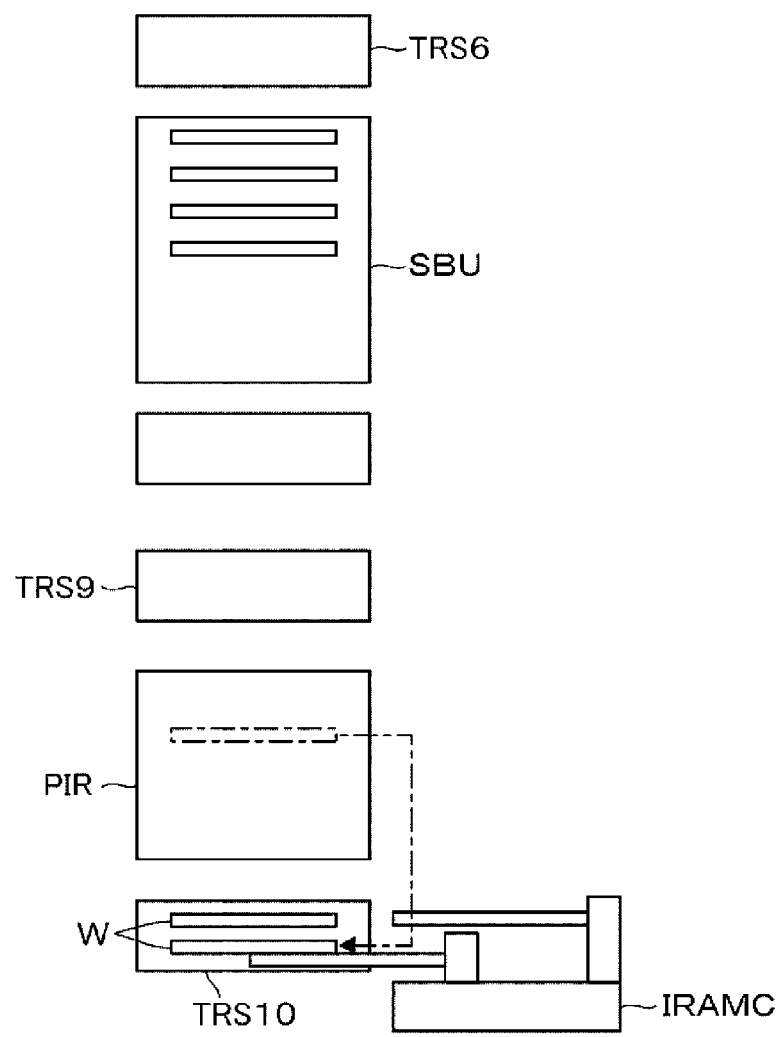
FIG. 12 is a schematic view illustrating the transfer status of a wafer.

It is assumed that the wafer W has not been transferred to the TRS9 at the time when the wafer W has been processed by the PIR and may be unloaded (see, e.g., FIG. 8). At this time, the transfer mechanism IRAMC waits for transfer of the wafer W from PIR to TRS10. The upper limit of the waiting time is determined from the above block CT. More specifically, such an upper limit is determined based on the block CT of each layer preceding the layer on which the waiting is to be performed in the transfer path. When a plurality of the same layers exists on the transfer path, the layer for which the waiting is performed is the layer in the step of performing such a waiting. In other words, the wafer W passes through the IRAMC layer twice, and the IRAMC layer through which the wafer W passes the second time corresponds to the layer where the waiting is performed.

As illustrated in FIG. 7, the CRA layer, MRA layer, MPRA layer, BCT layer, MPRA layer, COT/ITC layer, IRAMC layer, IRAMB layer, PRAI layer, and IRAI layer precede the IRAMC layer for waiting. For the block CT, the CRA layer, MRA layer, MPRA layer, BCT layer, COT/ITC layer, IRAMC layer, IRAMB layer, PRAI layer, and IRAI layer are 7.5 seconds, 3.7 seconds, 6.6 seconds, 9.9 seconds, 7.2 seconds, 8.9 seconds, 7.4 seconds, 9.0 seconds, and 10.0 seconds, respectively. Therefore, the maximum value in the above-mentioned values is 10.0 seconds for the IRAI layer. Since the block CT is the time during which one cycle of transfer is performed for each layer as described above, the wafer W is normally transferred to the IRAMC layer at intervals of 10.0 seconds. Therefore, the waiting time is determined as 10 seconds. That is, setting is made so that the maximum waiting time is 10.0 seconds from the time when the transfer of the wafer W becomes possible from the PIR.

When the wafer W is transferred from the IRAI layer to the TRS9 within the waiting time of 10.0 seconds (see, e.g., FIG. 9), the transfer mechanism IRAMC performs the replacement and transfer. That is, the wafer W is received from the TRS9 (see, e.g., FIG. 10), the wafer W is replaced by the PIR, and the wafer W processed by the PIR is transferred to the TRS10 (see, e.g., FIG. 11). Meanwhile, when the wafer W is not transferred to the TRS9 even after the waiting time of 10.0 seconds has passed, it is determined whether there is a wafer W that may be transferred by the transfer mechanism IRAMC (whether there is a wafer W at the transfer source and the transfer destination module is empty). That is, it is determined whether the transfer is possible for TRS6→SBU and PIR→TRS10, and when the transfer is possible only for PIR→TRS10, the transfer is performed. That is, the wafer W of the PIR waiting for transfer is transferred to the TRS10 (see, e.g., FIG. 12).

It is assumed that it is determined that both TRS6→SBU and PIR→TRS10 may be transferred when the waiting time has passed. In such a case, it is determined how many wafers W are present in each section from the relay module to which the wafer W is transferred by the transfer mechanism IRAMC to the relay module immediately before the nearest processing module when viewed downstream of the transfer path.

More specific descriptions will be made on a section in which the number of wafers W is determined as described above (referred to as a number determination section). The wafer W is transferred to the relay module SBU by the transfer mechanism IRAMC. Seen downstream from the SBU, the nearest processing module is the BST (see, e.g., FIG. 6). There is TRS7 included in the PRAI layer as a relay module between the BST and the SBU. Therefore, the period from SBU to TRS7 is one of the number determination sections, and is represented as reference numeral "41" surrounded by a dotted line in FIG. 13. Further, since the wafer W is transferred to the TRS10 by the IRAMC, the TRS10 is included in the number determination section. Seen downstream from the TRS10, since the immediately following module is the processing module PEB (see, e.g., FIG. 6), there is no module to be determined downstream of the TRS10. Therefore, only one TRS10 constitutes another number determination section, which is represented as reference numeral "42" surrounded by a dotted line in FIG. 13. The number of wafers W existing between the number determination sections 41 and 42 is compared, and it is determined in which number determination section the number of wafers W is the smallest. Then, the transfer mechanism IRAMC operates so that the transfer to the module is performed in the number determination section in which the number of wafers W is relatively small.

Figure 13:
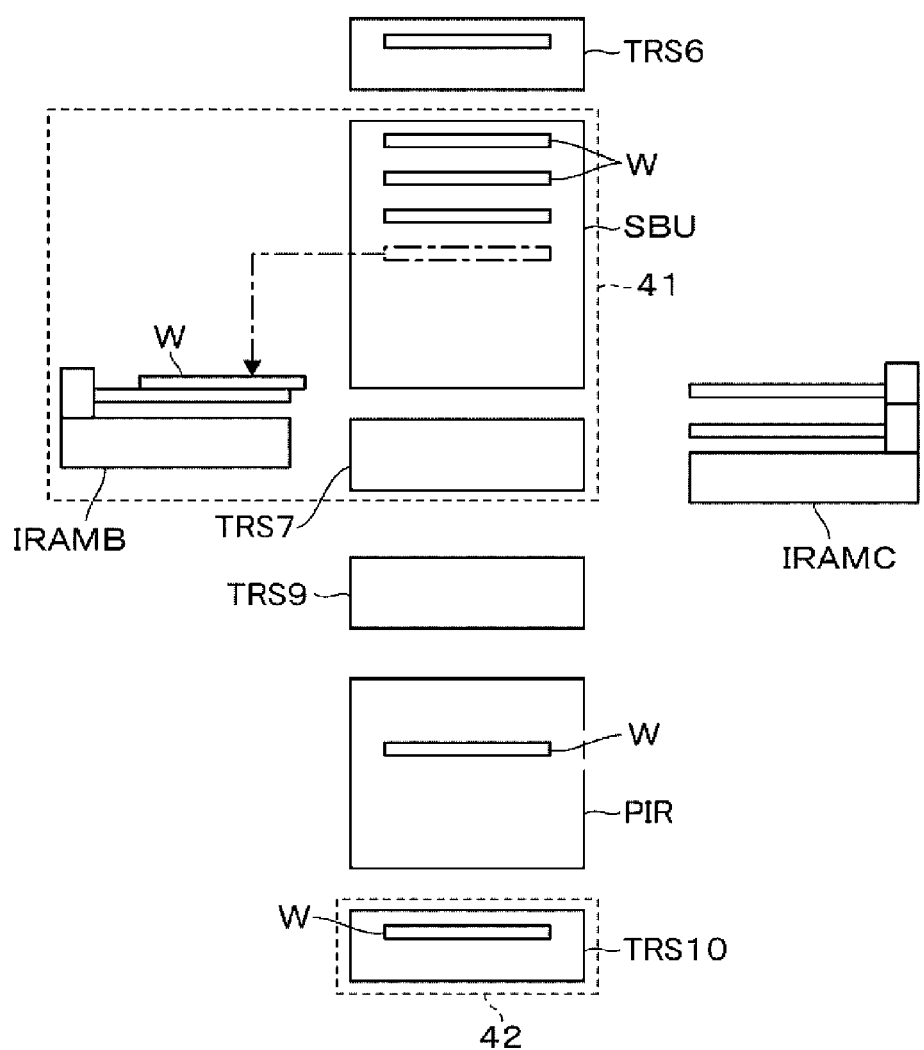
FIG. 13 is a schematic view illustrating the transfer status of a wafer.

In the example illustrated in FIG. 13, when the waiting time of 10 seconds has passed, there are three wafers W in the SBU, one wafer W being transferred from the SBU to the TRS7 by the transfer mechanism IRAMB, and zero wafer W in the TRS7. Therefore, a total of four wafers W are present in the number determination section 41 Meanwhile, only one wafer W exists in the TRS10 which is the number determination section 42. Therefore, regarding the number of wafers W, SBU to TRS7 (4 wafers)>TRS10 (1 wafer), and the number determination section 42 (TRS10) is relatively small. Therefore, the IRAMC performs the transfer of PIR→TRS10 (see, e.g., FIG. 14).

Figure 14:
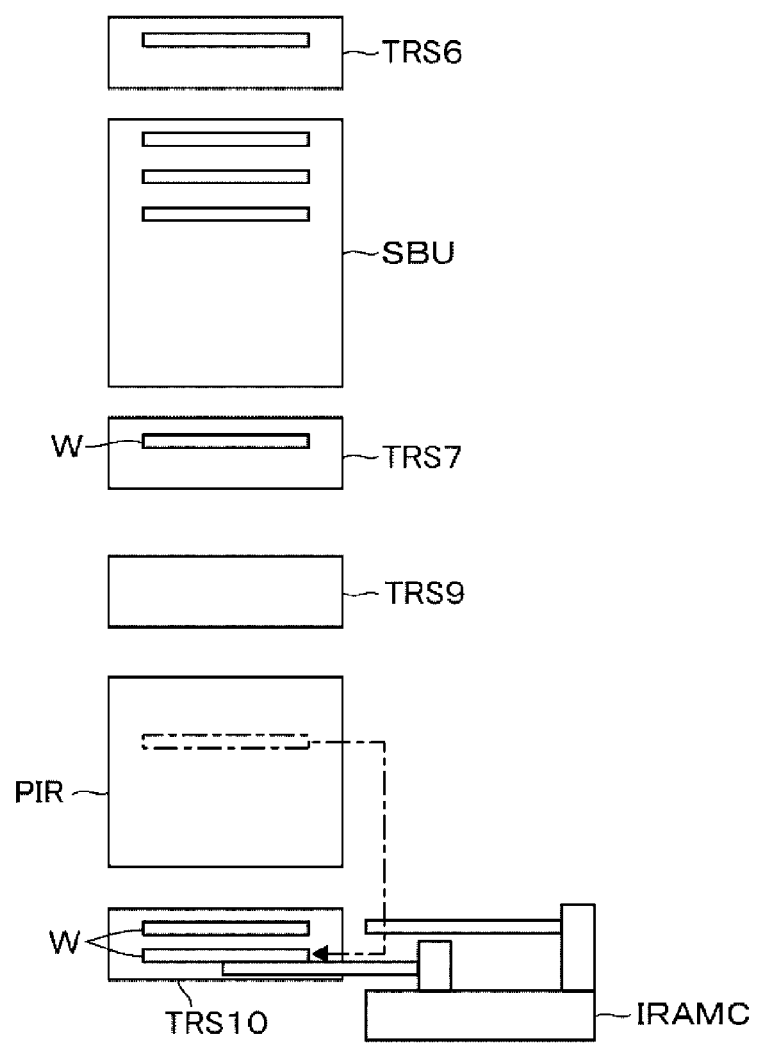
FIG. 14 is a schematic view illustrating the transfer status of a wafer.

Descriptions will be made below on the reason why the transfer mechanism IRAMC transfers the wafer W as illustrated in FIGS. 13 and 14. That fact that the wafers W are accumulated in the transfer path from a certain relay module to the relay module immediately before the nearest processing module when viewed downstream means that even when the wafer W is transferred to the certain relay module, there is a preceding wafer W to be transferred to the processing module. When there are many preceding wafers W, even when the wafer W is transferred downstream from a certain relay module, it takes time for the wafer W to be processed by the above processing module. In contrast, when the number of preceding wafers W is relatively small, there is a risk that the wafers W transferred to the processing modules may be spaced apart from each other, thereby reducing the productivity of the apparatus. In other words, in which step of the transfer path the transfer mechanism IRAMC transfers the wafers W is selected so that an appropriate number of wafers W is supplied to each processing module.

Meanwhile, it is assumed that after comparing the number of wafers W between the number determination sections 41 and 42 described with reference to FIG. 13, the number of wafers W is the same. In this case, the number of empty slots (slots in which wafers W are not transferred) of the relay module serving as the transfer source is compared for each of the sections TRS6→SBU and TRS9→PIR→TRS10. That is, the numbers of empty slots in TRS6 and TRS9 are compared, and the transfer mechanism IRAMC receives the wafers W from the module with the smaller number of empty slots, and transfers the received wafers W downstream.

Figure 15:
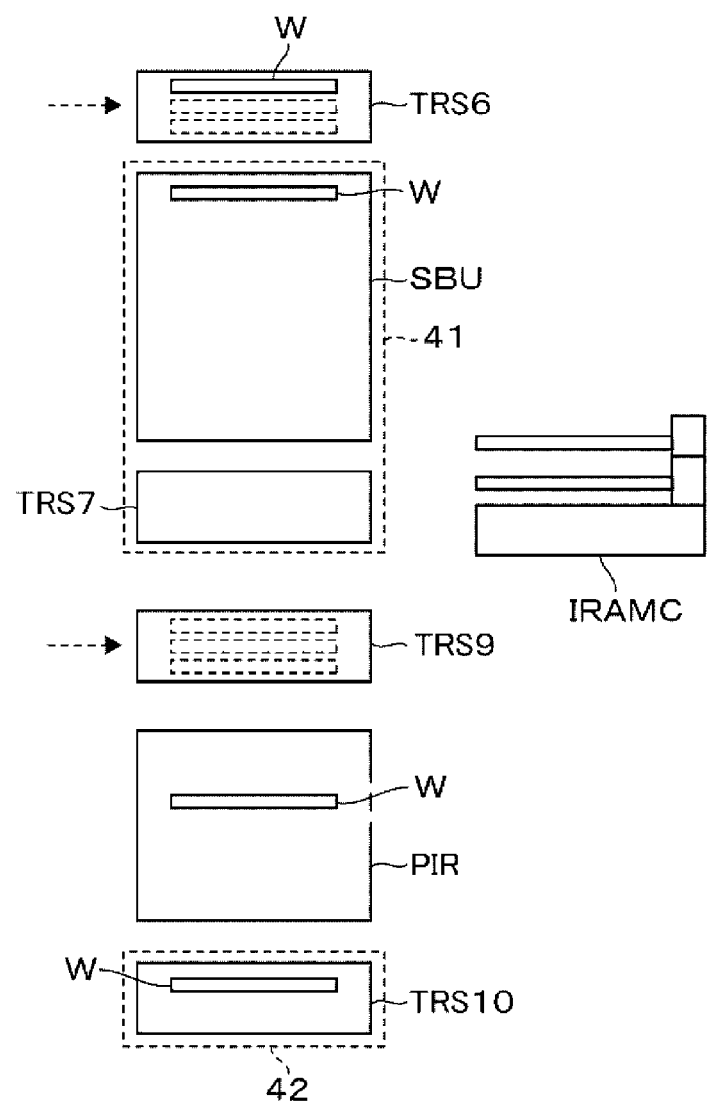
FIG. 15 is a schematic view illustrating the transfer status of a wafer.
Figure 16:
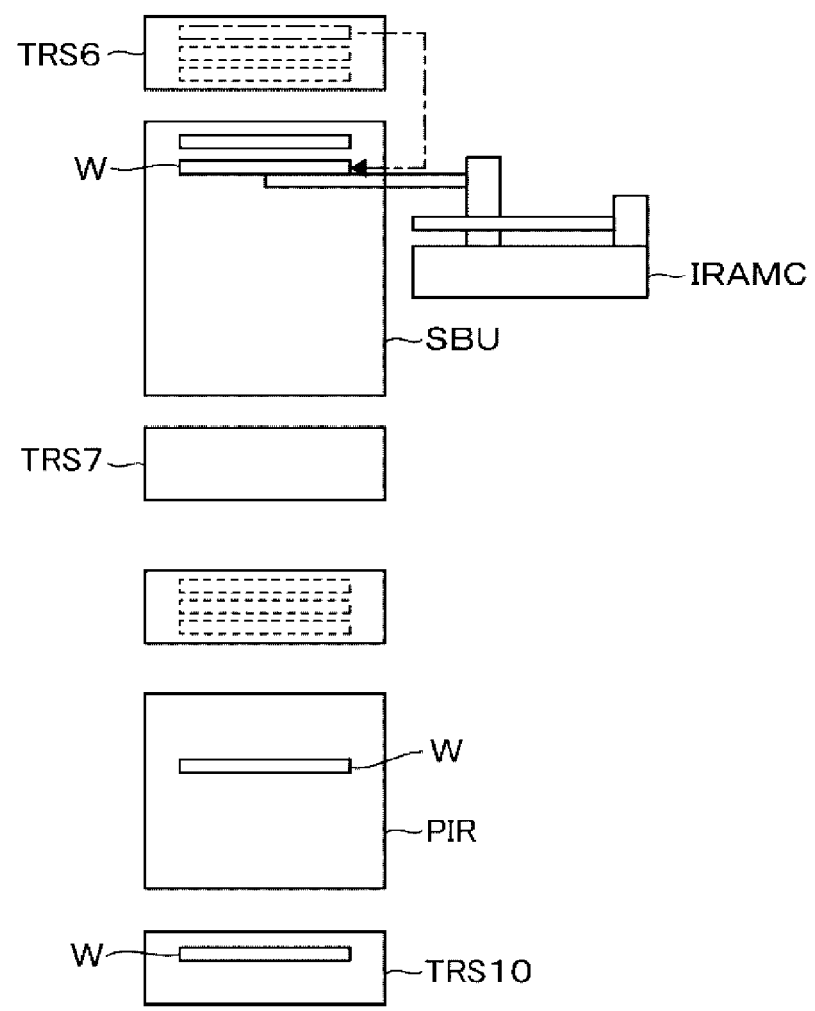
FIG. 16 is a schematic view illustrating the transfer status of a wafer.

Specifically, for example, it is determined that the number of wafers W present in SBU to TRS7 (i.e., the number determination section 41) and TRS10 (i.e., the number determination section 42) is the same as one. In this case, the numbers of empty slots are compared between TRS6 and TRS9. In the example of FIG. 15, it is represented that each TRS has three slots, one wafer W is loaded into TRS6, and zero wafer W is loaded into TRS9. Therefore, since TRS6 has fewer empty slots (represented by dotted lines in FIG. 15) than TRS9, the transfer mechanism IRAMC performs transfer from TRS6 to SBU (see, e.g., FIG. 16). When the number of wafers W waiting for transfer increases in a certain module and the slots are filled up, the transfer on the upstream side of the module is delayed. The wafers W to be transferred in this way are selected to avoid such situation.

As a result of comparing the number of empty slots in this way, when the TRS6 and TRS9 to be determined have the same number, the next step of the previous transfer is performed. That is, in the IRAMC layer, transfer is performed for TRS6→SBU, TRS9→PIR, and PIR→TRS10. However, a control is made such that when the previous transfer is TRS6→SBU, the transfer of TRS9→PIR is performed, when the previous transfer is TRS9→PIR, the transfer of PIR→TRS10 is performed, and when the previous transfer is PIR→TRS10, the transfer of TRS6→SBU is performed. However, as explained so far, the wafer W has not reached the TRS9 at present. Therefore, in the IRAMC layer, when the number of empty slots is the same, when the previous transfer was PIR→TRS10, only the control is made such that that the transfer of TRS6→SBU is performed this time. Performing the transfer of the next step after the transfer performed previous time will also be described in detail in the description of transfer in the MPRA layer.

When the wafer W is not being transferred, the transfer mechanism IRAMC promptly transfers the wafer W to the SBU when the wafer W is transferred to the TRS6. As described with reference to FIG. 8, even while waiting for the wafer W to be transferred from the PIR, the transfer mechanism IRAMC transfers the wafer W to the SBU as soon as the wafer W is transferred to the TRS6. This is to suppress occurrence of a situation in which the TRS6, which may accommodate a smaller number of wafers W than the SBU, is clogged and the subsequent wafers W may not be transferred to the TRS6.

Supplementary information is provided regarding the waiting time set for the replacement by the PIR described in FIGS. 9 to 12. As described above, when the wafer W may be unloaded from the PIR and the wafer W has not been transferred to the TRS9, the waiting time is calculated from the block CT of each layer. However, as described above, the block CT of each layer is calculated based on the number of usable modules. In other words, the waiting time during transfer of the wafer W of one PJ is not constant, but changes according to the status of the modules of each layer.

Various comparisons, determinations, decisions, and calculations for performing the transfer control in the IRAMC layer described above are performed by the control unit 10 described above. In the following description, the transfer control performed in the MPRA layer and the PRAI layer will be explained sequentially, focusing on the differences from the transfer in the IRAMC layer 10. Various determinations, decisions, and calculations for performing the transfer control are also performed by the control unit 10 which constitutes a determination unit.

In the MPRA layer, as illustrated in FIG. 6, the transfer of the wafer W is performed in three sections separated from each other in the transfer path, specifically, TRS2→TRS3, TRS4→TRS5, and TRS11→TRS12. When the transfer may be performed in only one of the three sections, the transfer is performed in the corresponding section. When the transfer may be performed in a plurality of sections, the determination of which section to transfer is made in the same manner as the determination of which of TRS6→SBU and PIR→TRS10 to transfer in the IRAMC layer explained in FIGS. 13 to 16.

Figure 17:
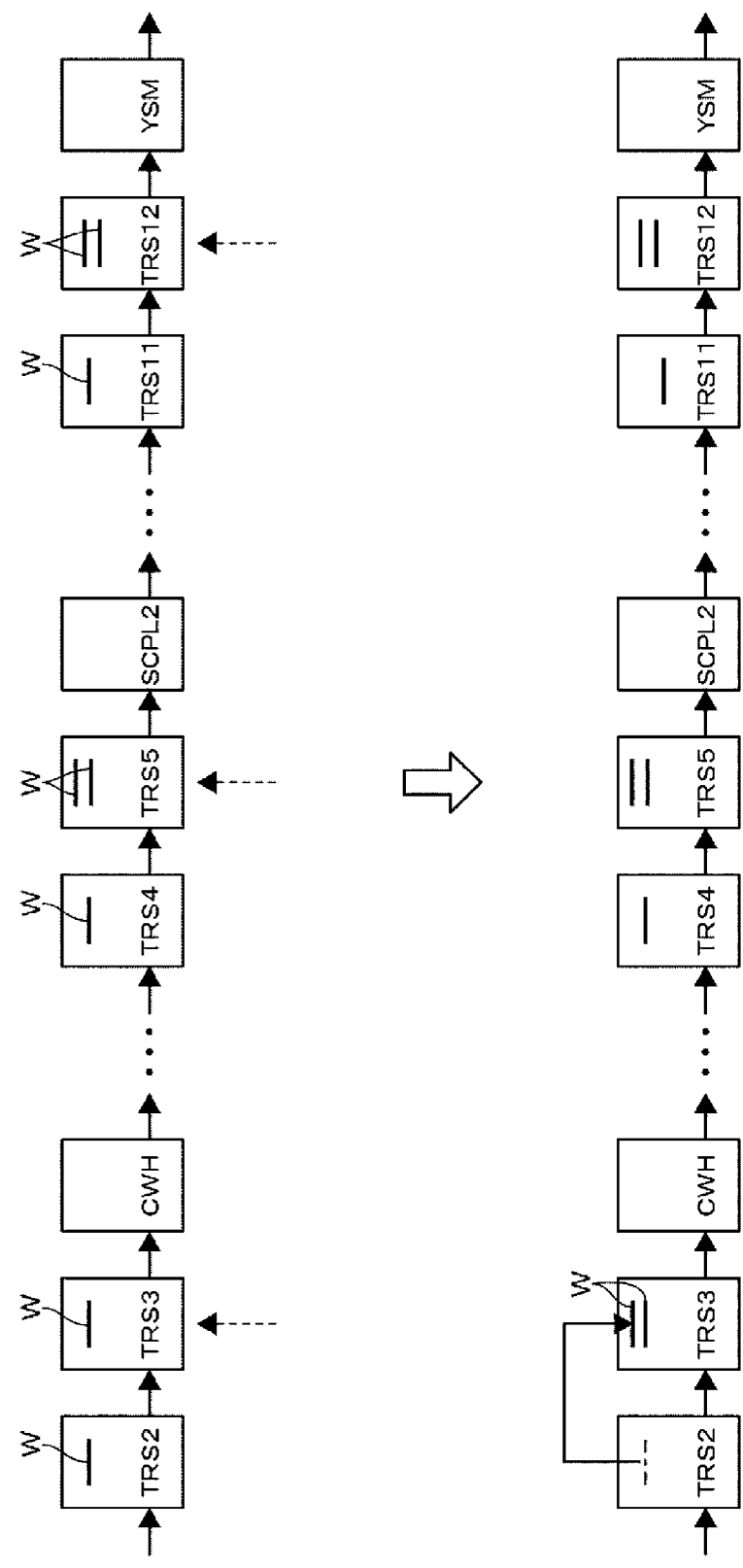
FIG. 17 is a schematic view illustrating the transfer path of a wafer.
Figure 18:
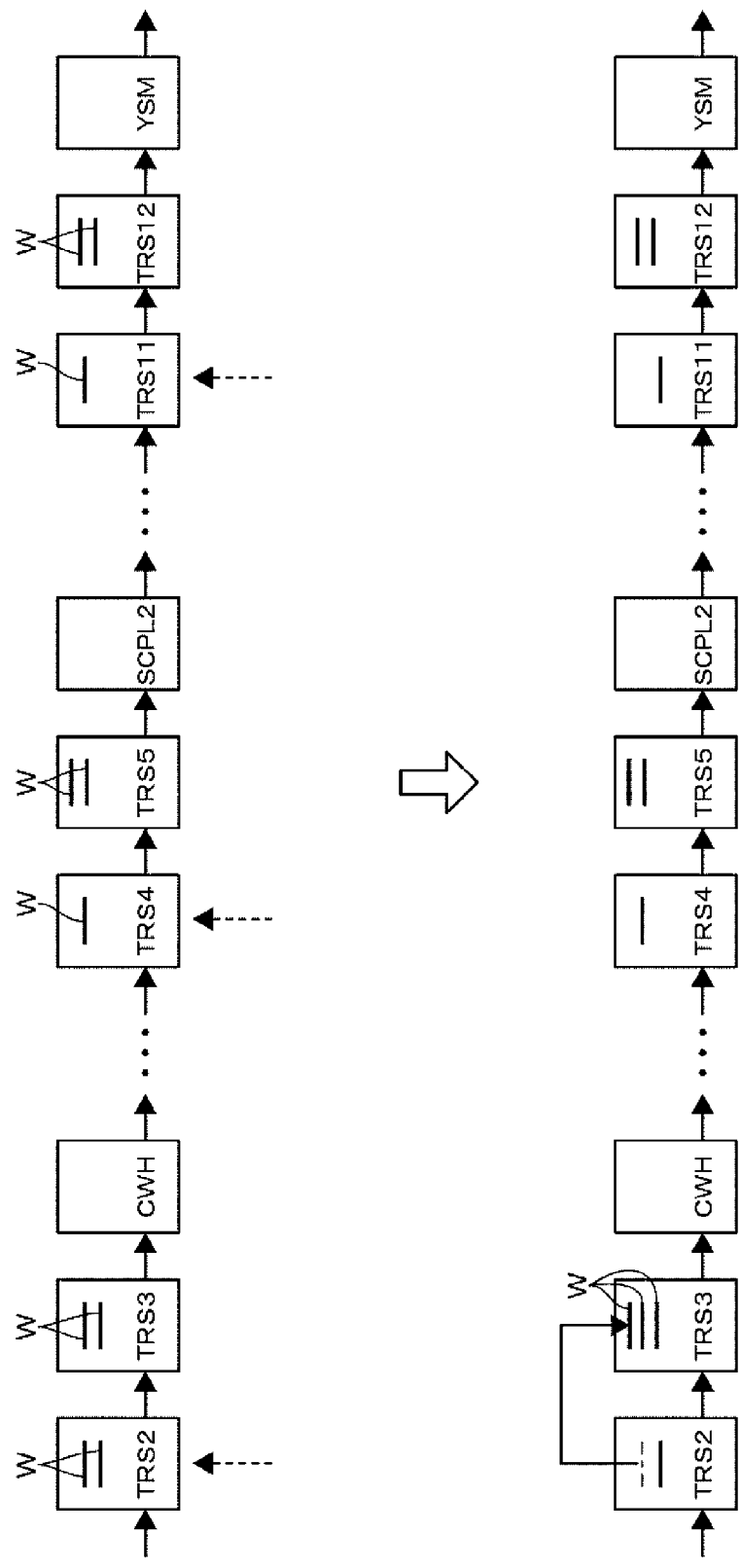
FIG. 18 is a schematic view illustrating the transfer status of a wafer.

Determination of transfer in the MPRA layer will be specifically described with reference to FIGS. 17 and 18. First, it is determined how many wafers W are present in each number determination section from the relay module capable of being transferred by the transfer mechanism MPRA to the relay module immediately before the nearest processing module when viewed downstream. Then, the wafer W is transferred to the relay module in the number determination section where the number of wafers W is relatively small. For example, it is assumed that the wafer W may be transferred in any of TRS2→TRS3, TRS4→TRS5, and TRS11→TRS12. Since the processing modules CWH, SCPL2, and YSM are provided immediately downstream of TRS3, TRS5, and TRS12, respectively, the number determination sections are TRS3, TRS5, and TRS12 (indicated by dotted arrows in the upper part of FIG. 17). In other words, it is determined that the wafers W are transferred to the module having the smallest number of wafers W among the TRS3, TRS5, and TRS12. In the example illustrated in FIG.

17, one wafer W is transferred to TRS3, and two wafers W are transferred to TRS5 and TRS12. Therefore, since the number of wafers W in TRS3 is the smallest, the transfer from TRS2 to TRS3 is performed as illustrated in the lower part of FIG. 17.

Assuming that after comparing the number of wafers W in the number determination section TRS3, TRS5, and TRS12, the number of wafers W are the same, the number of empty slots in the relay module from which the MPRA transfers to the modules is compared. Then, the transfer is performed such that the wafer W is unloaded from the module with the smaller number of empty slots. The relay modules from which TRS3, TRS5, and TRS12 are transferred are TRS2, TRS4, and TRS11, respectively, as indicated by dotted line arrows in the upper part of FIG. 18. In the example illustrated in FIG. 18, two wafers W are transferred to TRS2, and one wafer W is transferred to TRS5 and TRS12, respectively. Therefore, since TRS2 has the smallest number of empty slots, the transfer from TRS2 to TRS3 is performed as illustrated in the lower part of FIG. 18.

As a result of comparing the number of empty slots at the transfer source, when the numbers are the same, the step following the previous transfer is performed. That is, when the previous transfer was TRS2→TRS3, then the transfer of TRS4→TRS5 is performed, when the previous transfer was TRS4→TRS5, then the transfer of TRS11→TRS12 is performed, and when the previous transfer was TRS11→TRS12, then the transfer of TRS2→TRS3 is performed. To supplement the reason for performing the transfer of the next step in this way, when the number of empty slots at the transfer source is the same, it is considered that the layer which determines the transfer destination of the wafer W is a rate limiting factor in the transfer of the wafer W in an apparatus, and the wafers W are accumulated at the transfer source. In addition, it is considered that the number of empty slots in each transfer source is the same because the cyclic transfer described above is performed in the layer. Assuming that the cyclic transfer is being performed as described above, since it is desirable to continue the cyclic transfer, the transfer in the next step after the previous transfer (the transfer performed immediately before) is performed as described above.

Next, the transfer in the PRAI layer will be described. The PRAI layer includes a backside cleaning module BST as a processing module. Whether the replacement and transfer are performed in the BST is determined in the same manner as in the IRAM layer. Therefore, when the wafer W has been transferred to the TRS7 (see, e.g., FIG. 6) preceding the BST when the process in the BST is completed, the PRAI receives the wafer W, replaces the wafer W at the BST, and transfers the received wafer W to the TRS8.

When the wafer W has not been transferred to the TRS7 when the process is completed in the BST, a waiting time is set in the same manner as in the case of transfer in the IRAMC layer. The waiting time is set to be the maximum time in the block CT in the layer preceding the PRAI layer. Therefore, when the block CT is calculated as illustrated in FIG. 7, since the maximum one of the layers preceding the PRAI layer is 9.9 seconds in the BCT layer, the 9.9 seconds is set as the waiting time. When the wafer W is transferred to the TRS7 before the waiting time passes, the transfer mechanism PRAI performs the replacement and transfer. When the wafer W is not transferred to the TRS7 even after the waiting time has passed, the transfer mechanism PRAI transfers the wafer W processed by the BST to the TRS8. In other words, no replacement is performed at the BST.

The waiting described above is not performed when switching PJ in the BST. Specifically, when the wafer W of one PJ has been processed in the BST and the next wafer W to be transferred to the BST is the wafer W of another PJ, the wafer W of one PJ is transferred to the TRS8 as soon as the transfer mechanism PRAI becomes ready for transfer without waiting. The pressure in the BST may be changed when the PJ is switched. Thus, when replacement is to be performed, after the transfer mechanism PRAI receives the wafer W of one PJ from the BST, there is a possibility that the wafer W of the next PJ may not be transferred to the BST until the pressure change is completed. In other words, stopping the transfer by the transfer mechanism PRAI is suppressed by avoiding waiting.

Similarly to the BST, the above-described waiting is not performed for the PIR when the PJ is switched. The exposure machine EIF provided in the preceding stage of the PIR needs time to prepare for processing (e.g., replacing a reticle) when the PJ is switched. This is because it takes a relatively long time to transfer the wafer W of one PJ after the wafer W of another PJ is processed in the PIR.

For example, when the wafer W to be replaced by the BST has not reached the immediately preceding processing module (i.e., WES; see, e.g., FIG. 6) viewed from the BST, waiting is not performed because it takes a relatively long time for the wafer W to reach the BST. For example, similarly, when the wafer W to be replaced by the PIR has not reached the immediately preceding processing module (i.e., EIF; see, e.g., FIG. 6) viewed from the PIR, waiting is not performed because it takes a relatively long time for the wafer W to reach the PIR. In this manner, it is possible to determine whether to perform waiting depending on the transfer status of the subsequent wafer W on the front end of the processing module to be replaced. Whether to perform waiting may be determined based on, for example, the arrival status of the wafer W in the processing module two or more before the processing module to be replaced, not limited to the arrival status of the wafer W in the processing module immediately before the processing module to be replaced.

As described above, according to the coating and developing apparatus 1, the wafer W is transferred through the sections (between steps) separated from each other in the transfer path by a common transfer mechanism. In such a transfer, in which section the wafer W is to be transferred is determined based on the transfer status of the wafer W from the relay module in which the transfer is performed by the transfer mechanism to the relay module immediately before the nearest processing module when viewed from the downstream side. As a result, the transfer of the wafer W to the processing module before each section is suppressed from being delayed. Therefore, a high throughput may be obtained for the coating and developing apparatus 1.

In the IRAMC layer, when determining in which section the wafer W is transferred as described above, not only the transfer status of the wafer W in the IRAMC layer, but also the transfer status of the TRS7 in the PRAI layer, which is not accessed by the transfer mechanism IRAMC, is referenced. In addition to the transfer status of the wafer W in the layer in which the transfer destination is selected in this way, the transfer status of the wafer W in other downstream layers is also referenced to determine in which section the wafer W is transferred. Therefore, it is possible to more reliably suppress the delay in transferring the wafer W to the processing module described above, thereby increasing the throughput of the apparatus.

In addition, in the IRAMC layer, when the replacement and transfer may not be performed by the PIR, the transfer is performed by selecting the section as described above. In other words, the replacement and transfer are preferentially performed. According to the replacement and transfer, wafers W are continuously loaded into and unloaded from one module. Thus, as the replacement and transfer are performed more often, the movement of the transfer mechanism IRAMC between modules may be suppressed, and the number of operation steps of the transfer mechanism IRAMC may be reduced. Therefore, by preferentially performing the replacement and transfer as described above, a high throughput may be obtained more reliably.

In addition, a waiting time is set for determining whether to perform the replacement and transfer in the PRAI layer and the IRAMC layer. However, the waiting time is set based on the block CT in each layer preceding the layer including the processing module to be replaced and transferred. After the waiting time has passed, the processed wafer W is unloaded from the processing module without being replaced and transferred. Therefore, when the transfer to each of the PRAI layer and the IRAMC layer is delayed, it is possible to suppress the transfer mechanism from waiting unnecessarily for the wafer W to relace. As a result, a high throughput may be obtained more reliably.

Further, the block CT is calculated based on the MUT for the processing modules in each layer and the number of usable MUT, as described above. Therefore, for example, even when the number of modules that may be used changes due to trouble or maintenance, an appropriate waiting time is set. Thus, it is possible to suppress a decrease in the frequency of replacement and transfer in the PRAI layer and the IRAMC layer, thereby obtaining a high throughput more reliably. The waiting time is not limited to the maximum value of the block CT in each layer preceding the layer to be replaced, and for example, an arbitrary correction value may be added.

As described with reference to FIGS. 15 and 18, in the above example, based on the number of empty slots (the number of substrates that may be transferred) of the relay module from which the transfer mechanism takes out the wafer W, it is determined in which of the plurality of sections apart from each other the transfer is to be performed. However, such a determination is not limited to that based on the number of empty slots. For example, the determination may be made based on the ratio of slots into which wafers W are loaded to all slots. In other words, the above determination may be made based on the transfer status of the wafer W in the relay module from which the transfer mechanism unloads.

When determining the wafers W to be transferred by the transfer mechanism based on the transfer status of the wafer W in the section from the relay module where the transfer by the transfer mechanism is performed to the relay module immediately before the nearest processing module when viewed downstream, the transfer status of the wafers W is not limited to the number of wafers W. For example, it may be the ratio of slots into which wafers W are loaded to all slots of relay modules existing in the section. However, the number of slots may differ between relay modules. For example, as described above, SBU and TRS have different numbers of slots. Therefore, in order to perform the transfer by grasping the transfer status of each section so that a decrease in throughput may be more reliably suppressed, the number of wafers W may be used as the transfer status.

The modules mounted in the apparatus are not limited to the above examples. Therefore, the substrate processing apparatus of the present disclosure is not limited to being configured as the coating and developing apparatus 1. For example, the apparatus may be configured to include a chemical solution coating module for forming an insulating film and a module for supplying an adhesive for bonding the wafers W together.

In the MPRA layer and the IRAMC layer, it is assumed that the transfer determination based on the above-described transfer status of the wafer W is not performed and that the IRAMC layer and the PRAI layer each perform a calculation of the waiting time based on the block CT and a replacement and transfer within the waiting time. Even in such a case, it is possible to obtain the above-described effects by properly setting the waiting time, thereby improving the throughput of the apparatus.

The embodiments disclosed this time are to be considered in all respects as illustrative and not restrictive. The embodiments described above may be omitted, substituted, or changed in various forms without departing from the scope of the appended claims and the subject matter thereof.

DESCRIPTION OF SYMBOLS

1: coating and developing apparatus
10: control unit
IRAMB: transfer mechanism
IRAMC: transfer mechanism
SBU: buffer module
TRS10: delivery module
PIR: post-exposure cleaning module
W: wafer

What is claimed is:

1. A substrate processing apparatus comprising:
a module group including a plurality of processing modules each configured to process substrates and a plurality of relay modules on which the substrates are respectively disposed to be transferred among the plurality of processing modules;
a plurality of transfer arms each configured to transfer the substrates in an assigned section of a transfer path so that the substrates are loaded into and unloaded from the processing modules by a common transfer arm, the substrates are loaded into and unloaded from the relay modules by different transfer arms, and the substrates are sequentially transferred in the transfer path of the substrate constituted by the module group;
a shared transfer arm that forms one of the plurality of transfer arms, is shared for transfer in a first section and a second section separated from each other in the transfer path of the substrate, and transfers the substrates to each of a first relay module included in the first section and a second relay module included in the second section among the plurality of relay modules; and
a controller configured to determine a transfer destination of the substrate by the shared transfer arm between the first relay module and the second relay module based on a transfer status of the substrate in each section from each of the first relay module and the second relay module to a relay module immediately before a nearest processing module when viewed from each of the first relay module and the second relay module to a downstream side of the transfer path.

2. The substrate processing apparatus according to claim 1, wherein the controller performs the determination based on the transfer status of the substrates in each of a relay module on an upstream side of the first relay module in the first section and a relay module on an upstream side of the second relay module in the second section.

3. The substrate processing apparatus according to claim 2, wherein the transfer status of the substrates in each of the relay module on the upstream side of the first relay module and the relay module on the upstream side of the second relay module relates to a number of substrates capable of being transferred to each of the relay modules.

4. The substrate processing apparatus according to claim 2, wherein the controller performs the determination according to a section in which the shared transfer arm transfers a substrate immediately before.

5. The substrate processing apparatus according to claim 1, wherein the transfer status of the substrates in each section up to the relay module immediately before the nearest processing module relates to a number of substrates in each section.

6. The substrate processing apparatus according to claim 1, wherein a relay module in which the substrates are not transferred by the shared transfer arm is included in a section from the first relay module to the relay module immediately before the nearest processing module when viewed from the first relay module to the downstream side of the transfer path or a section from the second relay module to the relay module immediately before the nearest processing module when viewed from the second relay module to the downstream side of the transfer path.

7. The substrate processing apparatus according to claim 1, wherein the first section includes one processing module provided on the upstream side of the first relay module and a third relay module provided on an upstream side of the one processing module, the shared transfer arm includes a plurality of holders each holding a substrate to replace the substrate processed in the one processing module with a substrate unloaded from the third relay module, and the controller performs the determination in a state where the processed substrate is unloaded from the one processing module and a substrate is not transferred to the third relay module.

8. The substrate processing apparatus according to claim 7, wherein the controller performs a time setting that sets a time from a time point when the processed substrate is capable of being unloaded from the one processing module to a time point when the substrate is transferred according to the determination.

9. The substrate processing apparatus according to claim 8, wherein the controller calculates an expected time interval for transferring the substrate to a subsequent section for each section divided by a transfer arm which takes charge of transfer before the first section in the transfer path, and the time is set based on the expected time interval of each section.

10. The substrate processing apparatus according to claim 9, wherein the expected time interval is calculated based on a number of the processing modules included in one section and a residence time of the substrate in the processing module.

11. A substrate processing method comprising:

processing substrates in each of a plurality of processing modules;

disposing the substrates on each of a plurality of relay modules for transferring the substrates among the plurality of processing modules;

loading and unloading the substrates into and from the processing modules by a common transfer arm;

loading and unloading the substrates into and from the relay modules by different transfer arms;

transferring the substrates in sections respectively assigned to a plurality of transfer arms on a transfer path of the substrates constituted by a module group including the plurality of processing modules and the plurality of relay modules, and sequentially transferring the substrates along the transfer path;

transferring the substrates to a first relay module and a second relay module by a shared transfer arm shared for transfer in a first section constituted by the plurality of relay modules and including the first relay module, and a second section constituting the plurality of relay modules and including the second relay module, which are separated from each other in the transfer path of the substrate and forms one of the plurality of transfer arms; and determining a transfer destination of the substrates by the shared transfer arm between the first relay module and the second relay module based on a transfer status of the substrate in each section from each of the first relay module and the second relay module to the relay module immediately before a nearest processing module when viewed from each of the first relay module and the second relay module to a downstream side of the transfer path.

* * * * *